United States Patent [19]
Perelli

[11] Patent Number: 6,022,762
[45] Date of Patent: Feb. 8, 2000

[54] PROCESS FOR FORMING A MORPHOLOGICAL EDGE STRUCTURE TO SEAL INTEGRATED ELECTRONIC DEVICES

[75] Inventor: Alberto Perelli, Recco, Italy

[73] Assignee: STMicroelectronics S.R.L., Agrate Brianza, Italy

[21] Appl. No.: 09/368,559

[22] Filed: Aug. 5, 1999

Related U.S. Application Data

[62] Division of application No. 09/014,364, Jan. 27, 1998.

[30] Foreign Application Priority Data

Jan. 31, 1997 [EP] European Pat. Off. ............. 97830030

[51] Int. Cl.⁷ .............................. H01L 21/56; H01L 21/60
[52] U.S. Cl. ......................... 438/126; 438/599; 438/611; 438/623
[58] Field of Search .................................... 438/126, 599, 438/611, 623, FOR 342

[56] References Cited

U.S. PATENT DOCUMENTS

| | | | |
|---|---|---|---|
| 4,396,934 | 8/1983 | Nishida et al. | 257/383 |
| 5,219,792 | 6/1993 | Kim et al. | 438/631 |
| 5,463,246 | 10/1995 | Matsunami . | |
| 5,593,925 | 1/1997 | Yamaha | 438/703 |
| 5,763,936 | 6/1998 | Yamaha et al. | 257/620 |

FOREIGN PATENT DOCUMENTS 0 453 787 A1  10/1991  European Pat. Off. .

OTHER PUBLICATIONS

Moriya et al., Selective CVD of Tungsten and Its Applications to MOS VLSI, 1985, pp. 21–32.

Lee et al., A Study of Tungsten Etchback For Contact and Via Fill Applications, Jun. 15–16, 1987, pp. 193–199.

Chiang et al., Defects Study on Spin Glass Planarization Technology, Jun. 15–16, 1987, pp. 404–412.

Kobayakawa et al., A Study of Outgassing From Spin–On–Glass Films, Jun. 11–12, 1991, pp. 454–456.

*Primary Examiner*—David E. Graybill
*Attorney, Agent, or Firm*—Theodore E. Galanthay; Allen, Dyer, Doppelt, Milbrath & Gilchrist, P.A.

[57] ABSTRACT

A process for the formation of a device edge morphological structure for protecting and sealing peripherally an electronic circuit integrated in a major surface of a substrate of semiconductor material includes formation above an intermediate process structure of a dielectric multilayer comprising a layer of amorphous planarizing material. The process also includes the partial removal of the dielectric multilayer so as to create at least one peripheral termination of the multilayer in the device edge morphological structure. Removal of the dielectric multilayer requires that the peripheral termination thereof be located in a zone of the intermediate process structure relatively higher than the level of the major surface, if compared with adjacent zones of the intermediate structure itself at least internally toward the circuit and in so far as to the device edge morphological structure.

20 Claims, 3 Drawing Sheets

PROCESS FOR FORMING A MORPHOLOGICAL EDGE STRUCTURE TO SEAL INTEGRATED ELECTRONIC DEVICES

This application is a division of Ser. No. 09/014,364 filed on Jan. 27, 1998.

FIELD OF THE INVENTION

The present invention relates to semiconductor processing, and, more particularly, to a process for the formation of an edge morphological structure designed to seal integrated electronic devices and associated device.

Specifically reference is made to a process for the formation of a device edge morphological structure for protecting and sealing peripherally an electronic circuit integrated in a major surface of a substrate of semiconductor material. The electronic circuit is of the type calling for formation over an intermediate process structure of a dielectric multilayer comprising a layer of amorphous planarizing material and partial removal of the dielectric multilayer so as to create at least one peripheral termination of the multilayer in the device edge morphological structure.

BACKGROUND OF THE INVENTION

As is well known, electronic devices, in particular those integrated monolithically, if not carefully protected and sealed can be critically affected by the environmental conditions in which they are placed during assembly and/or during their lifetimes. In particular, the presence of humidity and other contaminating agents can result in the entry of undesired materials into the electrically active part of the device. This generally reduces the reliability of the device and can even irreversibly compromise its operation.

It is therefore crucial, especially for certain applications, to make the best possible provision for protection and sealing of the electrical circuit which is part of the device. For this purpose it is necessary to ensure perfect sealing also at the edge of the device.

For the meaning of edge of a device it should be remembered that a plurality of identical monolithically integrated circuits are formed simultaneously on a single wafer of semiconductor material, commonly monocrystalline silicon, in adjacent prepared areas. The individual devices are spaced and separated by unoccupied cross strips in which the surface of the silicon is left exposed. These strips are typically mutually orthogonal and are known as "scribe lines" and the wafer will be cut through them mechanically to separate the individual devices (the so-called "dicing" process). The edge of a device is thus the peripheral region thereof bordering on the associated scribe line.

After formation of the circuit electrical structures, i.e., of the electrical components, such as, for example, transistors or memory cells and their interconnections, the device is insulated and sealed. Layers of dielectric materials act as electrical and thermal insulators of the conducting interconnection layers and protect the underlying structures of the integrated circuit from mechanical stress such as impacts or from contaminants (impurities, moisture) by creating a barrier against those harmful substances coming from the environment.

The so-called final passivation includes a relatively thick layer completely covering the device to protect it. However, at the edge of the device the presence of the final passivation alone is not sufficient to ensure its sealing. Other measures are necessary. For this purpose primarily the most peripheral structures of the device are typically left inactive, i.e., disconnected electrically from the device terminals.

More specifically, for protection of the device at the edges there is formed a structure arranged peripherally which also permits sealing of the device. This is a device edge morphological structure and reference will be made thereto in the following description. It includes a closed ring completely surrounding the device along its entire periphery. This structure is known to those skilled in the art as Chip Outline Band (COB) i.e., a band surrounding the device.

The device edge morphological structure is formed simultaneously with the electrical structures of the integrated circuit. The more internal part of the COB, i.e., the part nearest the device, does indeed normally include structures which appear morphologically identical to the electrically active ones of the device. However, they do not have any electrical function since they are electrically insulated, but only act as termination for the device end. The COB structure is consequently different in different devices depending on the process used and the device design.

In any case the more external part of the COB, which terminates in the scribe line adjacent to and is contiguous with the preceding part, is designed so as to completely seal the device from the external environment. For this purpose there is applied the simple principle in accordance with which, to permit better sealing, each overlying layer must be terminated more externally than the one immediately below. The layers are disposed to virtually cover and enclose the previous layer. This way the edge descends gradually downward while going near the associated scribe line, such as to enclose the integrated circuit in subsequent shells, several times. An example of a device edge morphological structure of known type is shown in FIG. 1. Specifically there is represented in cross-section, not to scale, a peripheral portion of a single device. By way of example this is in particular a CMOS device, such as typically a memory circuit.

It is necessary to remember that in the more complex integrated circuits it is becoming ever more pressing to limit the area occupied by reducing the size of the components, and, thus, of the device to thereby increase the total number of devices which can be integrated on a single wafer. Accordingly, two or more interconnection levels are provided. It is in this framework that the present description is placed. The device to which reference is made by way of example in the figure comprises two interconnection levels.

In FIG. 1 the visible portion of the device edge morphological structure is indicated as a whole by reference number 1. Further to the right of the figure is seen a scribe line which is shown only partially and indicated by reference number 2, while to the left the device edge morphological structure 1 joins the active part of the device, i.e., the actual circuit (not shown in the figure). It should be remembered that the device edge morphological structure is shown in its most peripheral portion—in some cases another portion thereof comprising other electrically inactive structures could be present at the device periphery.

In FIG. 1 for greater clarity the COB is divided approximately and ideally in two regions as set forth above: a region indicated by reference number 3 placed more internally with respect to the circuit and comprising structures defining a sort of extension with continuity of the device circuit structures, and a region 4 which is more external or peripheral and has a device sealing function. The device is formed in a major surface 5 of a substrate 6 of monocrystalline silicon. The process calls for simultaneous formation of the circuit and its edge structure.

Once the structure of the electric circuit components (not shown in the figure) have been completed, a so-called "intermediate" dielectric layer acting as their insulation is formed above. In FIG. 1 can be seen the portion, indicated by reference number 7, of this layer which is included in the device edge morphological structure 1. Conventionally the intermediate dielectric comprises a Boron Phosphorus Silicon Glass (BPSG) layer, i.e., silicon oxide doped with boron and phosphorous. In the intermediate dielectric there are opened appropriate holes to the surface 5 of the substrate to allow contact therewith by overlying conducting levels.

A first interconnection level, i.e. a metallization layer, typically aluminum, more briefly known as "METAL 1", is overlaid on the intermediate dielectric 7. The first metallization layer, indicated by reference number 8, has portions in direct contact with the surface 5 through the above mentioned holes, denominated contacts, formed in the intermediate dielectric and not shown in the figure.

The metallization layer 8 is then patterned so as to have the appearance of metallic strips. As shown in FIG. 1, in this embodiment the METAL 1 in region 4 has a peripheral termination in contact with the surface 5 of the substrate 6. This peripheral termination is more external than the peripheral termination of the intermediate dielectric 7.

Over the first interconnection level 8 is formed a multilayer of dielectric material to insulate it from a subsequent second overlying metallization layer or briefly "METAL 2" indicated by reference number 9. In the description given below reference is made to this multilayer as to an intermetallization dielectric multilayer or intermetallization dielectric because it is placed between two metallization layers. The intermetallization dielectric is indicated as a whole by reference number 10 and also acts as a planarizer of the surface before formation of the second metallization layer 9 to ensure a deposition and a definition thereof without drawbacks.

As shown in FIG. 2 indeed, after formation of the METAL 1 layer, the resulting intermediate process structure displays zones with different heights. The intermediate process structure for this exemplified process is indicated as a whole by reference number 11 in the figure. It comprises the intermediate dielectric layer 7 and the first interconnection layer 8 already patterned. It can be observed from the figure that the free surface of the structure 11 displays considerable differences in height with a sort of stepped profile. This is true in general and to a different degree even in other process steps and typically is true for the intermediate structures created after deposition of each interconnection level.

As shown in FIG. 1, to planarize the surface of the structure 11, the overlying intermetallization dielectric 10 includes a layer of Spin-on Glass (SOG) which as known is commonly used for planarization in various steps of the formation of the integrated circuits. This is an amorphous material which is deposited in the fluid state, as a solution, by means of a "spinning" process, i.e., being sprayed over the entire surface of the wafer where it is deposited in such a manner as to fill the deepest zones and smooth the irregularities of the underlying structure. After hardening by evaporation of the solvent, a following anisotropic etching of the SOG leaves its top surface virtually planar, although a slight meniscus is formed because of the surface tension of the material. The etching is stopped when the relatively higher zones of the underlying structure are completely exposed.

It should be remembered, however, that the SOG, since it is a highly contaminating material because of its origin, must be enclosed between insulating layers so as not to come into contact with the active structures of the circuit. Specifically, as shown in FIG. 1, the intermetallization dielectric 10 hence includes a first layer comprising a silicon oxide, typically TEOS (tetraethylorthosilicate) indicated by 12, a layer of SOG 13 and a second layer of TEOS 14. The TEOS is chosen preferably because it has good chemical and physical characteristics and is a material which does not introduce contamination.

In accordance with the prior art process the first TEOS layer 12 is arranged conformal with the intermediate process structure 11 (FIG. 2) and accordingly displays a profile which is still not planar. Formation of SOG in accordance with what above mentioned so as to fill only the deepest portions, permits planarization of the surface. In this manner, after the conformal deposition of the second TEOS layer 14 there is obtained a virtually planar surface for deposition of the second interconnection level 9.

Following its formation, holes are opened in the intermetallization dielectric 10 by means of masking, these holes permitting formation of the so-called VIAs for contact between METAL 2 and METAL 1. As may be seen in the figure, in region 4 of the device edge morphological structure 1 the intermetallization dielectric 10 is terminated outside the termination of the first conducting layer 8, in accordance with the principle set forth above to ensure good sealing of the device. In accordance with a prior art technique, formation of the peripheral termination of the intermetallization dielectric multilayer takes place simultaneously with formation of the openings of the VIAs in the intermetallization dielectric 10, i.e., by using an opening in the same mask.

FIG. 1 shows a single VIA 15 in the region 3 of the edge morphological structure 1. The intermetallization dielectric 10 is, therefore, discontinuous since it is separated in two portions, one, indicated by reference number 10', being included in the region 3 and the other, shown by reference number 10", extending into both regions 3 and 4 of the morphological structure 1.

On this subject it should be remembered that formation both of the contacts, which allow connection between a metallic interconnection and the substrate or circuit components, and of the VIAs between conducting layers of different levels is very critical in very large scale integration manufacturing processes because of the extremely small cross-sectional dimensions which they must have and of the relatively great thickness of the dielectric layer through which the holes must be made. Under these conditions during sputtering deposition of the metallization layer which will form the contact the cover of the vertical walls of the "holes" becomes unsatisfactory and the metal deposited can display unacceptable thinning. On the other hand, it is not possible to reduce the thickness of the dielectric layer, and, hence, the depth of the contact proportionately to the cross-sectional dimensions. An approach commonly used includes using, for the metallization portion which is to be inside the holes, a metallic material, typically tungsten, titanium and/or titanium nitride, which can be deposited by chemical vapor phase deposition to allow easy filling of the hole.

In this direction there was developed a technique according to which the holes are first filled with tungsten plugs. The aluminum layer is then deposited so as to form the conducting layer. Techniques of this type are described, e.g., in the articles, "Selective CVD of tungsten and its applications to MOS VLSI" by Takahiko Moriya and Hitoshi Itoh, VLSI Research Center, Toshiba Co., presented at the Workshop 1985 of the Material Research Society; "A study of tungsten etchback for contact and VIA fill applications" by Jen-Jiang Lee and Dennis C. Hartman, presented at the IEEE VLSI Multilevel Interconnection Conference (VMIC), 1987.

More specifically, in accordance with a process to which specific reference is made in the following embodiments of the present invention, for the formation of the contacts and the VIAs in the holes there is first deposited a pre-adhesion or barrier layer. Typically the barrier layer comprises a first layer of titanium (Ti) on which is deposited a second layer of titanium nitride (TiN)(altogether Ti/TiN) for a total thickness varying between 50 nm and 90 nm. On the barrier layer a tungsten layer is then deposited by the CVD technique. A subsequent etching leaves the tungsten only in the holes in the form of plugs. This technique is described for example in European patent application no. 0543254 assigned to the assignee of the present invention. An improvement of this technique is described in European patent EP 0571691 also assigned to the present assignee.

In FIG. 1 the barrier layer Ti/TiN is indicated by reference number 16 and the tungsten plug by reference number 17. It is noted that, since the process calls for the peripheral termination of the intermetallization dielectric 10 to be obtained by means of a mask for formation of the VIAs, a tungsten residue is also present in the zone of the above mentioned termination. As may be seen in the figure, since an anisotropic etching is used, after partial removal of the tungsten for formation of the plugs a so-called tungsten bead, indicated by reference number 18, with an underlying very thin barrier layer (not shown), remains beside the above mentioned termination.

Like the first interconnection level 8, the second level 9 also terminates by contacting the surface 5 of the substrate more peripherally than the termination of the intermetallization dielectric multilayer. A relatively thick final passivation layer, indicated by reference number 19, completes formation of the device by providing protection of the circuit elements and the interconnection levels.

To allow separation of the devices provided on the same wafer the final passivation layer is then etched in the scribe line region, i.e., in region 2, until reaching the substrate surface 5. The scribe line has been formed at this stage. FIG. 1 shows the device as it appears at the termination of this step.

The process for formation of the device edge morphological structure 1 just described concomitantly with the electrical circuit formation process and illustrated in FIGS. 1 and 2 displays, however, some drawbacks which appear evident from an analysis of the obtained structure 1. It should be noted in fact that normally the SOG, in accordance with the conventional planarization process with three layers diagramed above, is completely enclosed between dielectric material layers. This is visible even in FIG. 1 in the region 3 of the device edge morphological structure, i.e., as concerns the intermetallization dielectric portion 10 placed more internally, to the left of the VIA 15.

However, as shown in FIG. 1, in accordance with the process for the formation of the device edge morphological structure in accordance with the prior art in the more external portion of the intermetallization dielectric multilayer 10 placed to the right of the VIA 15 and extending between the two regions 3 and 4, the SOG is not completely incorporated. Indeed, the intermetallization dielectric 10 in region 4 of the morphological structure 1 declines slowly in the direction of the device edge towards the surface 5 of the silicon until it reaches it. At the same time the SOG layer which as mentioned above forms a slight meniscus, is slowly thinned. The terminal etching of the intermetallization dielectric multilayer 10 immediately outside the termination of the first interconnection level 8 is performed in a zone where the thickness of the SOG layer 13 is not yet sufficiently reduced. Cutting of the multilayer 10 in accordance with the process described is performed far enough from the edge of the device so as to still permit formation further peripherally of the termination of the second interconnection level 9 in contact with the substrate. Accordingly the SOG terminal portion is not insulated from the second metallization layer 9, but instead is in contact with the tungsten bead 18.

The presence of SOG exposed to the next metallization layer 9 can give rise to a defects. In a certain percentage of devices there may in fact occur delayering of the overlying metallization level. As known to those skilled in the art, each SOG layer, if it has not been perfectly cured, shrinks before formation of the next metallization layer. The behavior of this material is due to a natural phenomenon known as outgassing. The problems of defects connected therewith when the outgassing occur at the interface with a metallization layer, as in our case, are illustrated for example in the article of C. Chiang, N. V. Lam, J. K. Chu, N. Cox, D. Fraser, J. Bozarth, B. Mumford, entitled "Defects study on spin on glass planarization technology", Proceedings Conference VMIC, 1987; and in the article of M. Kobayakawa, A. Arimatsu, F. Yokoyama, N. Hirashita, T. Ajioka, entitled "A study of outgassing from spin-on-glass films used for planarizing", Proceedings Conference VMIC, 1991. As analyzed in these articles the outgassing also leads to formation of structural defects in the metallic layers in direct contact with the SOG.

In addition, in the process just described and illustrated the presence of the tungsten bead in contact with the SOG enormously worsens the problem. As shown in FIG. 1 the SOG layer 13 when shrinking inwardly, before formation of the barrier layer Ti/TiN 16, leaves an empty space indicated by reference number 20 between the more external edges of the two dielectric layers 12 and 14. The side surface of the termination of the intermetallization dielectric 10, obtained after cutting of the dielectric and which must be covered by the second interconnection level, because of the SOG shrinkage, is accordingly irregular and with a negative slope.

This induces a stress in the barrier layer 16. To this is added the fact that the thickness of the barrier layer 16 is much reduced as described above and is deposited by an anisotropic technique, and, therefore, on such a negative step it is thinned, i.e., it does not have uniform thickness, and can even be missing at some points. For these reasons delayering of the barrier may occur, i.e., partial lifting thereof along the contact with the termination of the intermetallization dielectric.

The tungsten layer formed at this point is deposited both outside and inside the lifted edges of the barrier layer 16. It should be remembered that, during a common process for forming tungsten, tungsten fluoride is typically used as a source. This highly corrosive gas is able to penetrate any holes present in the barrier layer. Also the tungsten has high stress. The tungsten etching necessary for formation of the plugs thus generates a highly defective structure with holes. The following metallization layer 9 can accordingly be delayered, differently from how it appears in the ideal case shown in FIG. 1.

The device can be damaged in case of marked delayering in which there can be generated on the surface of the wafer residues of delaminated layers which cause short circuiting of active metallizations. The seriousness of the problem is on the other hand due to the fact that such a defective structure in the device edge morphological structure, which as such is not electrically active, may not immediately damage the functionality of the device. That is, the device in which this delayering phenomenon occurred at the terminal part of the METAL 2 would be functioning and would not fail upon testing. However, once operating it would become clearly unreliable in a more or less short time because it is not correctly sealed.

The problem described is accentuated in the devices located near the wafer edge, in which the barrier layer is thinned because it forms a meniscus upon deposition. A known attempt to solve this problem was given recently and is illustrated in FIG. 3. In this figure there is shown the same portion of the device edge morphological structure, here indicated by reference number 1', as in the preceding figure. The same reference numbers are kept for the same or equivalent structures and parts.

The approach includes modifying the etching masks of the VIAs, virtually avoiding opening a contact VIA in the intermetallization dielectric, whether in the more external region 4 of the device edge morphological structure or along the adjacent scribe line, for generating the peripheral termination of the layer. This means not etching the intermetallization dielectric in this zone as shown clearly in the figure. This avoids etching the SOG.

The layer of intermetallization dielectric 10 is accordingly as one might say extended to reach the region of the scribe line 2. It is etched away only during the following step of formation of the scribe line. This way the SOG layer 13 in the cutting region, i.e., the edge of the device in this case, is considerably thinned.

Differently from the case illustrated in the previous figure, the peripheral termination of the second interconnection level 9 is not in contact with the substrate as shown in FIG. 3. Anyway the second metallization layer 9 is removed in the zone adjacent to the scribe line 2 so that it is always isolated from the outside by means of the final passivation layer 19. The process just described accordingly allows obviating the problem of delayering of the METAL 2 at the bead, which is drastically eliminated. But this approach displays some drawbacks.

Although the intermetallization dielectric layer 10 is greatly extended and at the scribe line level where it is cut the SOG layer 13 is very thin, it is still necessary to point out that the latter is not completely absent. A small portion of SOG remains in contact with the outside. Since the SOG is hygroscopic because of its porosity there is the risk of moisture penetrating into the device with a resulting reliability problem.

Another problem is due to the structure obtained by means of this process. As may be readily seen, the dielectric layer on the scribe line before its etching is considerably increased with respect to the previous case shown in FIG. 1. Indeed, beyond the final passivation layer, on the scribe line there is also present the intermetallization dielectric 10. The total thickness, which can reach even 3 micron ($\mu$m), can be excessive in the following terms. Primarily, excessive thickness extends the total time needed for completely etching the scribe line and makes necessary an overetching to completely clean the scribe line. Thus the entire process is delayed. This also implies greater complexity in controlling the process flow.

In addition, at the end of the etching it may happen that the scribe line is not well cleaned. There may remain residue of the oxide making up the lower layer to be etched, i.e., in this case the first dielectric layer of the intermetallization dielectric, in the most critical etching zones. These zones are typically those at the edges of the scribe line, and, in particular, at the feet of the opening which must be formed, i.e., where the etching arrives with more difficulty if the step is very steep. Other critical zones are those in which the corridor to be etched is very narrow, and, therefore, where the height-to-width ratio is very high. This happens, for example, in corridors at the sides of testing structures present in the center of the scribe line and which are not to be removed in this etching step. The presence of these oxide residues mainly near the scribe line crossings can generate mechanical damage to the contiguous devices during the dicing process. From this point there is a relatively high probability that crossing fracture lines will depart towards the adjacent devices. The devices involved are clearly not well sealed.

The problem illustrated accordingly seems almost insoluble. Indeed, good sealing is prevented for any device in which SOG is to be used as the planarization layer, because of the presence of at least one subsequent metallization level. The same problem arises both in the framework of a intermetallization dielectric for a device having at least two interconnection levels, and in the case not specifically described in which the SOG is already used in the intermediate dielectric for devices having a single metallization level and in which inside the intermediate dielectric there are to be formed contacts for the first metallization level.

It should be noted that although the drawbacks described are discussed for the case exemplified in FIGS. 1–3, they can appear every time a dielectric having similar characteristics, such as an amorphous planarizing material highly contaminating especially for the metallization layers and capable of generating defects, is used for the planarization instead of SOG. In addition these drawbacks are very devastating when the contacts and the VIAs are created by means of the described plug technique.

SUMMARY OF THE INVENTION

In view of the foregoing background, it is therefore an object of the invention to provide a process and device edge morphological structure allowing perfect sealing of the device even when planarizing materials, such as SOG are present, and without increasing the complexity with respect to a conventional process because of added dedicated process steps.

The present invention relates to a process for the formation of a device edge morphological structure to protect and seal at the periphery an electronic circuit integrated in a major surface of a substrate of semiconductor material. The device edge morphological structure includes a dielectric multilayer which is formed over an intermediate process structure. In the dielectric multilayer is included a layer of amorphous planarizing material. After its formation the dielectric multilayer is partially removed from inside the device edge morphological structure in such a manner that it will have at least one peripheral termination there.

In accordance with the present invention, removal of this dielectric multilayer requires that the peripheral termination thereof be located in a zone of the intermediate process structure relatively high with respect to the level of the major surface, if compared with adjacent zones of the intermediate structure itself at least internally toward the circuit and in so far as to the device edge morphological structure. The most external termination of the dielectric multilayer i.e. is placed on the highest region considering that process step of the entire device edge morphological structure. This termination is accordingly higher than any more internal portion of the dielectric multilayer in the direction of the device, only in the region of the device edge morphological structure. In this manner the cut in the dielectric multilayer to create a peripheral termination is performed in a zone in which the layer of amorphous planarizing material, typically SOG, is not present at all, because during the process of its formation as explained above it is removed from the highest zones of the structure on which it is formed.

In the typical case where the dielectric multilayer comprises two dielectric layers, including, for example, TEOS enclosing the amorphous planarizing material. Only these dielectric material layers are left exposed after etching. The amorphous planarizing material is thus completely enclosed by two dielectric layers even inside the device edge morphological structure. In other words, the end part of the amorphous planarizing material is delimited by layers of non-contaminating dielectric material. Accordingly, in the present invention SOG exposed to the environment during the process or in contact with a subsequent metallization is avoided.

Advantageously, therefore, practically perfect sealing of the device is ensured since on the one hand passage of moisture through the material such as SOG is prevented because it is not in contact with the exterior. On the other hand, the fact that the contaminating material, and with critical behavior, is insulated from the following metallization layer prevents formation of defects with possible delayering of the metallization layer, especially where the contacts are formed by the tungsten plug technique. The prior art problems are thus solved.

In accordance with a preferred embodiment of the present invention as applied to an intermetallization dielectric multilayer, the peripheral termination of the dielectric multilayer is placed in a zone overlying a metallization layer. More specifically, the peripheral termination is located over an intermediate dielectric layer, in a structure commonly present in prior art processes. The peripheral termination of the dielectric multilayer is arranged more internally with respect to the peripheral termination of the underlying metallization layer. Accordingly, this termination of the intermetallization dielectric is moved away from the following overlying conducting layer.

In addition, according to the process in accordance with the present invention, no process steps are necessary in addition to those already included in a conventional process. Preferably, for example, in a CMOS process removal of the dielectric multilayer, if it is an intermetallization dielectric, is done using the VIA mask. For this purpose the preferred process provides that the dielectric multilayer be cut in correspondence with a contact VIA between two conducting levels, which is opened to the scribe line. Advantageously in this manner the contact area between the two conducting layers is increased and they are contacted together along the entire periphery of the device.

To further raise the peripheral termination of the dielectric multilayer it is possible, in accordance with the present invention, to create an additional difference in height by the formation in the more external region of the device edge morphological structure of another layer in the form of a bead having only this structural function.

BRIEF DESCRIPTION OF THE DRAWINGS

The characteristics and advantages of the process in accordance with the present invention are set forth in the description of an embodiment thereof given below by way of non-limiting example with reference to the annexed drawings. In the drawings.

DETAILED DESCRIPTION OF THE PREFERRED EMBODIMENT

Figure 4:
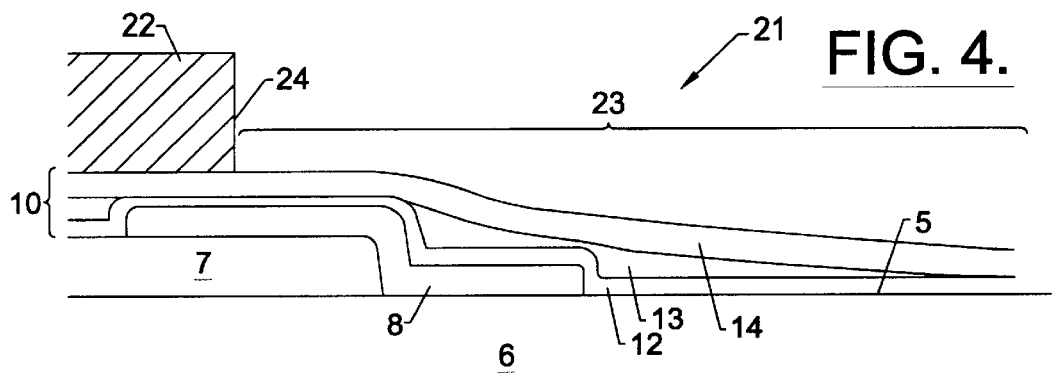
FIGS. 4 and 5 show a cross-section of the significant steps of a preferred process in accordance with the present invention for the formation of a device edge structure.
Figure 5:
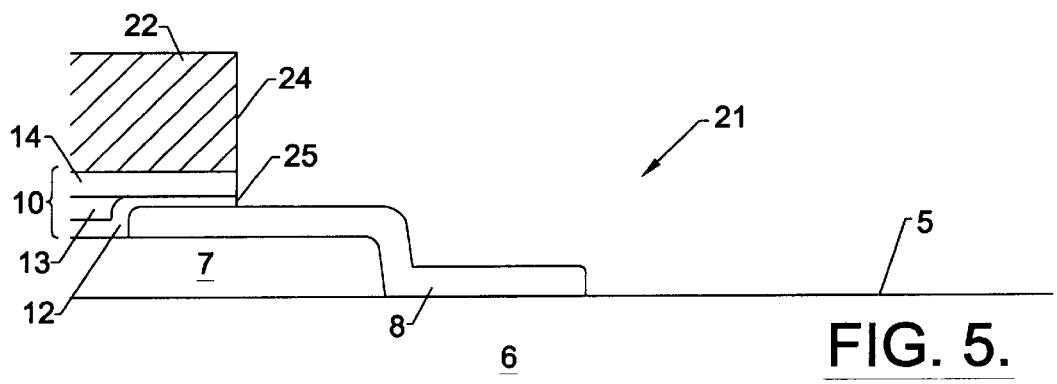
Figure 6:
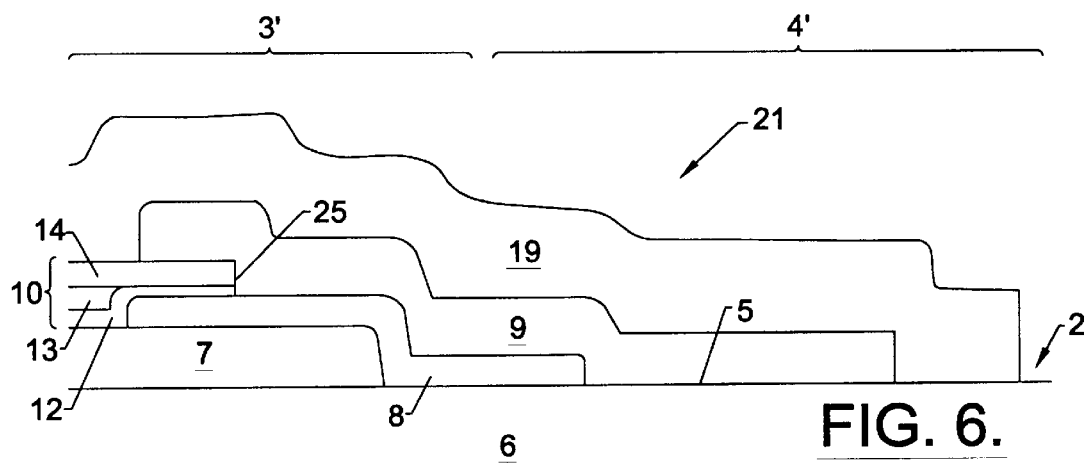
FIG. 6 shows schematically a finished structure provided in accordance with the process illustrated in the above figures.

With reference to FIGS. 4 to 6, reference number 21 indicates schematically and as a whole a device edge morphological structure or COB provided in accordance with the present invention. These figures are vertical cross-sections, not drawn to scale for greater clarity, and are made along any plane of cut parallel to an edge of the die. The device edge morphological structure is completely visible towards the edge, i.e., the scribe line, while an invisible part thereof could continue more internally towards the device.

The process for the formation of the edge structure 21 in this diagram is by way of example with two metallization levels. In this preferred example in addition the process is CMOS type with two polysilicon layers, usable typically for the formation of EPROM, EEPROM or Flash non-volatile memory circuits. By way of example there is used the same type of process, but modified in accordance with the present invention, as already described with reference to the prior art.

In the following figures the same reference numbers as used for illustration of the prior art approaches are maintained for elements or regions which are equal or equivalent. It should be remembered that only some of the process steps, significant for the present invention, are shown in FIGS. 4 to 6. Of the edge structure are indicated schematically separately both the more internal region indicated by reference number 3', which is an extension of the circuit structures, and the more external region 4', having more properly a sealing function.

With specific reference to FIG. 4 the process for sealing of the device comprises initially conventional steps for the formation of a device edge morphological structure. The latter is formed simultaneously with the electrically active structure of the device, located further internally on the die and not visible. In the major surface 5 of the substrate 6 of semiconductor material are formed active areas, delimited and defined by field oxide regions. In the active area regions one proceeds to formation of the device circuit structures. Typically in a memory device these are transistor gates, comprising the superimposition of a gate oxide layer and a polysilicon gate, and gates of the memory cells including a tunnel oxide, a floating gate and an overlying control gate, both of polysilicon and separated by an interpoly dielectric layer. The transistor and cell structures are not visible in the figures.

Over these structures and to insulate them is formed the so-called intermediate dielectric layer of which is visible in FIG. 4 a terminal part 7. Although it is illustrated as a single layer, the intermediate dielectric layer is normally made up of one or more silicon oxide layers, doped or not. Typically it comprises a layer of BPSG, as described above with reference to the prior art.

For electrical connection between the circuit components the first interconnection level including a conducting layer is deposited on the intermediate dielectric where windows have been opened and the contacts, not visible in the figures, formed appropriately either with the substrate or with the components. The first metallization layer is indicated by reference number 8 and is typically of aluminum or an alloy thereof, for example Al/Si/Cu.

Figure 2:
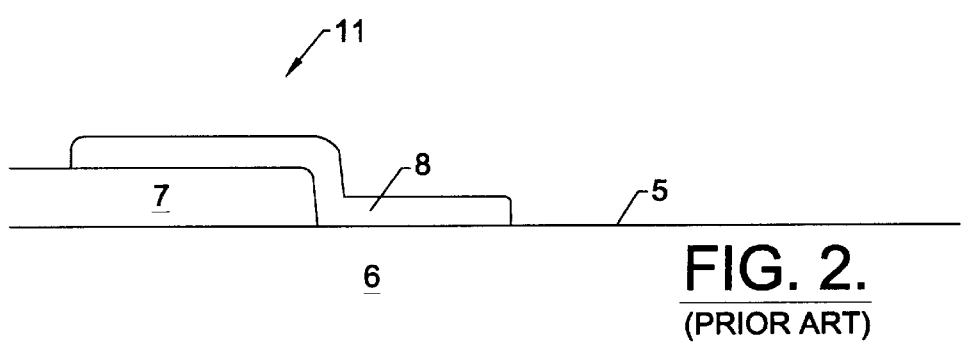
FIG. 2 shows an intermediate process structure as it appears during an intermediate step for formation of a device edge structure as in the prior art.

The layer 8 is then patterned in the form of strips by removing it elsewhere. In the device edge morphological structure 21, and in particular in region 4', the first metallization layer 8 terminates externally with respect to the intermediate dielectric 7, as shown in FIG. 4 and in accordance with the already known philosophy described above for sealing the device. The intermediate process structure thus obtained is the same as that shown in FIG. 2 with reference to the prior art and indicated by reference number 11.

Over the entire intermediate structure is formed the intermetallization multilayer of dielectric material, electrically insulating the first metallization layer 8 from the second upper interconnection level. The intermetallization dielectric, indicated as a whole by reference number 10, also acts as a planarizer of the entire surface and for this purpose comprises the layer of amorphous planarizing material, SOG in this case, indicated by reference number 13. The latter is enclosed between first and second dielectric layers. The process for formation of the intermetallization dielectric 10 calls for conformal deposition of the first dielectric layer 12 (TEOS in the typical embodiment of the present example) by one of the chemical vapor deposition techniques (CVD); then covering the entire surface by spinning with SOG; etching thereof until it is only left in the deeper portions of the resulting structure which is conformal to the intermediate structure 11 to form the layer 13; and lastly conformal CVD deposition of the following dielectric layer 14, also TEOS, to enclose the SOG 13.

At this step is applied the VIA mask, indicated by reference number 22 in FIG. 4, for opening through the intermetallization dielectric 10 of the contact VIAS between a following metallization layer, which is to be formed, and the first interconnection level 8. For this purposes a masking layer including a photosensitive material, such as, for example, photoresist is formed partially over the intermetallization dielectric multilayer 10. In accordance with a conventional process a photoresist emulsion is deposited with a thickness of 1–2 μm over the entire surface of the device. By a photolithographic process a part of the photoresist is removed in such a manner as to leave it only in some portions of the structure as shown in FIG. 4.

In accordance with the present invention and in this preferred embodiment, the masking layer 22 in the device edge morphological structure 21 displays an opening or window for etching, which is extended from the region 3' along the entire region 4' and the scribe line. More specifically, the opening for formation of the contact with the second metallization layer, already present in the prior art, is virtually widened in accordance with the present invention to the periphery of the device and onto the scribe line.

As shown in the figure the etching window, indicated by reference number 23, accordingly has the more internal wall, delimiting it along its perimeter and indicated by reference number 24 and visible in cross-section, located over a zone of the intermediate structure in that process step at a relatively higher level than the rest of the edge morphological structure 21. In particular, it is higher with reference to the surrounding region. In this zone the metallization layer 8 is placed over the intermediate dielectric 7. In other words, all around this zone are present deeper regions which have been filled with the planarizing material 13. As may be seen in FIG. 4, in the intermetallization dielectric underlying the wall 24 there is no layer of planarizing material 13 including SOG.

A subsequent step of the process calls for complete removal of the intermetallization dielectric multilayer 10 in the region defined by the window 23. Removal of the layer 10 of intermetallization dielectric is differentiated for the three layers 12 to 14 and is performed by means of conventional chemical and physical etching techniques either wet or dry. Preferably a dry etching is used. The etching is stopped on the underlying metallization layer 8 as shown in FIG. 5. Windows are thus opened in the integrated circuit for formation of the VIAs between the two interconnection levels.

The peripheral termination of the intermetallization dielectric 10, indicated by reference number 25, in accordance with the present invention is placed thus in turn on a high zone of the intermediate process structure 11. The intermetallization dielectric multilayer 10 in accordance with the present invention is accordingly totally eliminated from the more peripheral regions in which the partial structure is lower. In region 4' in the prior art approaches the intermetallization dielectric declined towards the scribe line.

In this manner the more peripheral portion of the intermetallization dielectric, which in accordance with the present invention is entirely included within the region 3', has its perimeter placed on a structure higher than the central portion even in its more external part with respect to the circuit. Along the termination 25 are present in contact the two TEOS layers 12 and 14. In other words, in its end zone the SOG is enclosed. In general the basically contaminating material is entirely delimited by an insulating and non-contaminating material like TEOS. The SOG, in the device edge morphological structure 21 for sealing, is accordingly fully insulated.

It should be remembered that removal of the most external portion of the intermetallization dielectric multilayer 10 is obtained in a simple manner in accordance with the preferred embodiment of the present invention. Indeed, only the VIA mask layout is modified. In addition the only cut made in the intermetallization dielectric within the morphological structure 21, along the line represented by the segment 24–25 in FIG. 5, is made without etching the SOG and accordingly is not critical in accordance with the present invention.

The masking layer 22 is removed at this step. One then proceeds to formation of the contact VIAs for the second metallization level typically in accordance with the tungsten plug technique described above. In accordance with the preferred embodiment of the present invention, in the device edge morphological structure removal of the tungsten for formation of the plugs provides for the nearly total elimination of the tungsten.

Figure 1:
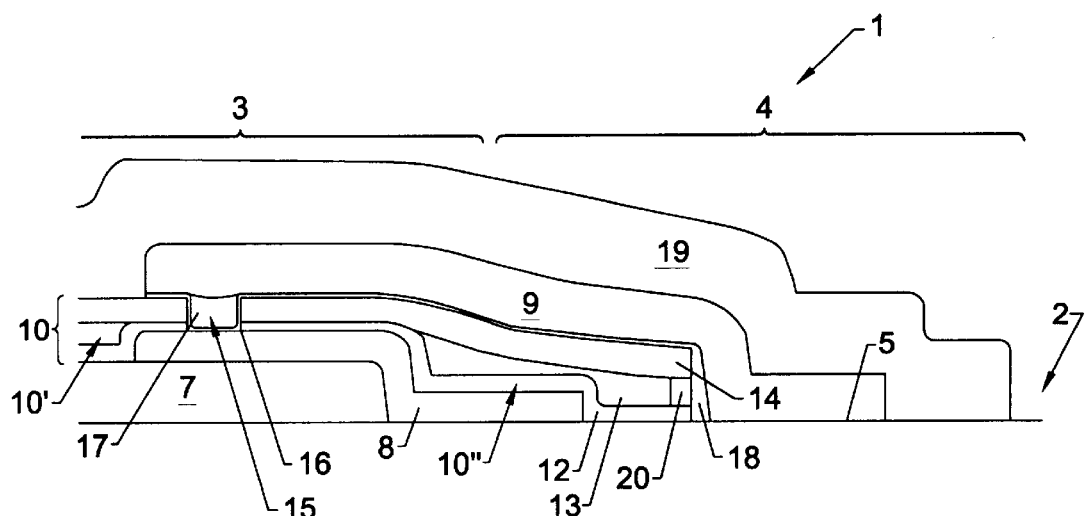
FIG. 1 shows a cross-section of a peripheral portion of a device, by way of example of the CMOS type, with an edge morphological structure for sealing, provided in accordance with a prior art process and already described above.
Figure 3:
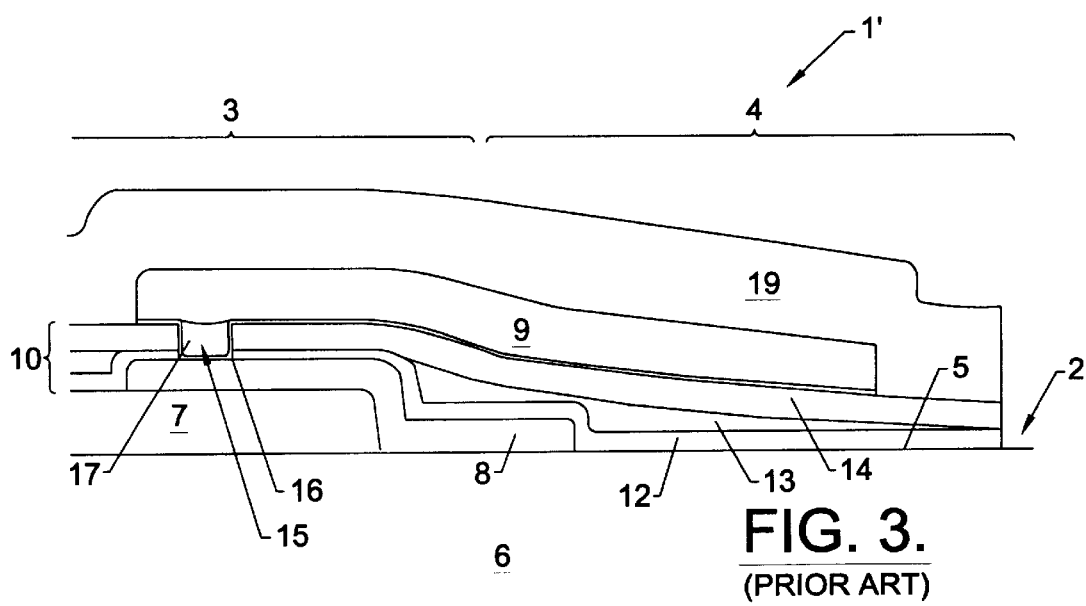
FIG. 3 shows the same peripheral portion of the device of FIG. 1 as obtained by an improved prior art process.

The conducting layer 9 is finally deposited and then patterned in accordance with the selected configuration. In region 4' in this step a peripheral termination is created for this layer. A conventional mask (not shown), can preferably be used easily in the region of the device edge morphological structure in this embodiment of the present invention. The mask, for example, can be the same as that for patterning the layer 9 in the known cases illustrated in FIGS. 1 and 3. The metallization level 9 terminates in this case, too, more externally than the underlying metallization layer 8.

In accordance with a preferred embodiment of the present invention as shown in FIG. 6 at the periphery of the device in region 4' the two interconnection levels are contacted. The termination of the two levels appears as a strip in which they are in contact along the entire perimeter of the device. The two metallization levels 8 and 9 are contacted without interposition of the tungsten layer. This is not in fact necessary because the contact area is sufficiently widened to permit good adhesion between the two conducting layers.

The process for the device forming is completed in the conventional manner by formation of the final passivation layer 19 over the entire surface of the wafer and then cleaning of the scribe lines 2. Even though the passivation layer appears in FIG. 6 as a single layer it can include the superimposition of divers layers of lesser thickness, equal or different, depending on the process used. FIG. 6 shows the device after cleaning of the scribe lines 2.

Advantageously, therefore, in accordance with the preferred process just describe the external perimeter of the intermetallization dielectric in the individual die displays two TEOS layers 12 and 14 in contact without SOG. The absence of exposed SOG ensures good reliability to the formed device in terms of sealing. Indeed, on one side contact of the SOG with the second metallization level 9 is avoided by totally removing the intermetallization dielectric in the more external portion 4'. In this manner the intermetallization dielectric 10 is ended more internally with respect to the first metallization level 8 differently from the known structures. It is due to this among other things that the peripheral end of the first metallization level is in contact with a peripheral portion of the second level. Only more internally the second metallization level contacts the peripheral termination 25 of the intermetallization dielectric 10 without exposed SOG.

It should be remembered also that due to the preferred solution of the present invention the second interconnection level does not need to be deposited on a steep and possibly negative step. Reliability of the deposition of the second conducting layer is thus improved. On the other hand, the SOG is not extended to the scribe line and thus is not exposed to the environment. The problem of moisture penetrating into the device directly through this material is thus avoided.

In addition in the preferred embodiment described the two metallization levels are in contact along a sufficiently wide area, greater than the conventional contact area and determined by the opening of the VIAs. This improves elimination of the electrostatic charges accumulated in these conducting layers. In addition, the configuration of the VIA mask, actually open on the scribe line, avoids having on the scribe line the intermetalization dielectric layer which would increase the total thickness to be removed during the final etching for cleaning the scribe lines.

Figure 7:
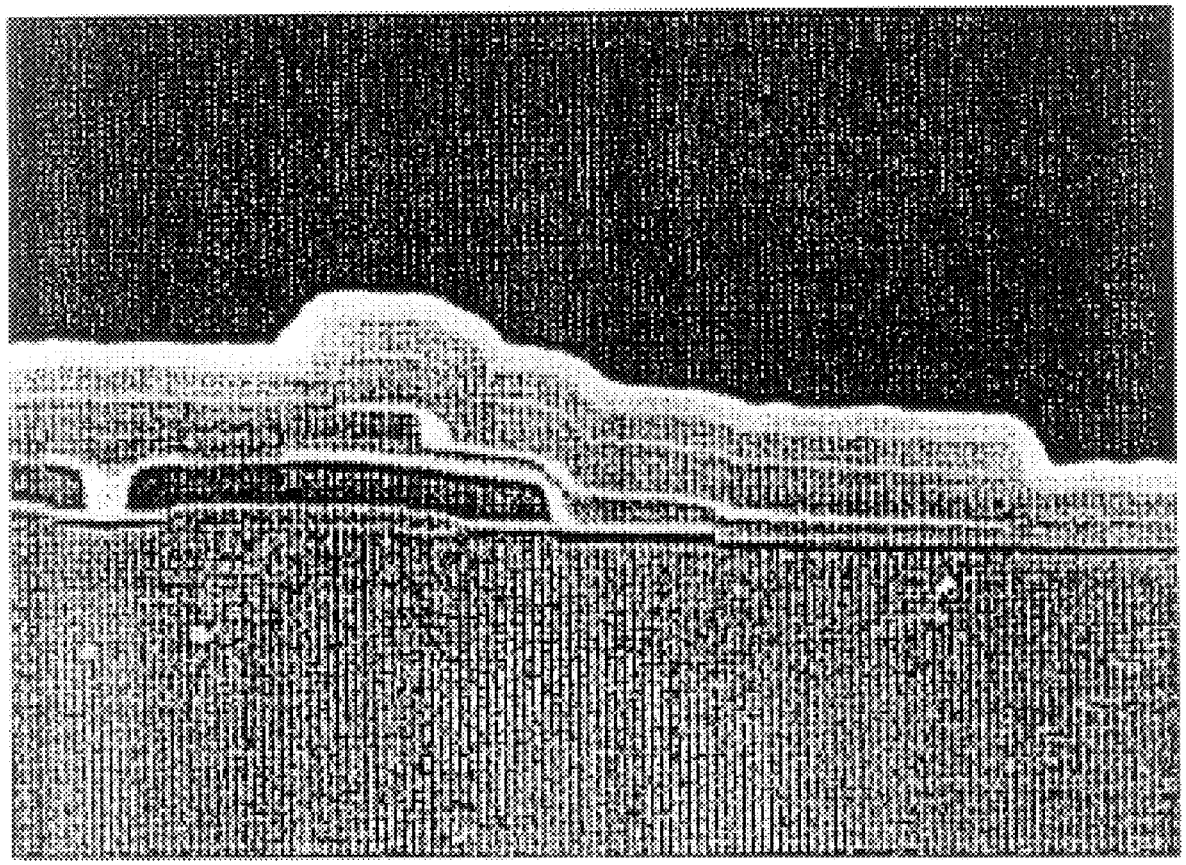
FIG. 7 shows a scanning electron microscopy (SEM) photograph of a similar device edge morphological structure without defects, as obtained by the illustrated process.

FIG. 7 is an electron-microscope photograph using the SEM technique of a finished device formed by the process in accordance with the present invention diagramed in the above figures, in the same region and by the same process. As may be seen, the device at the edge does not display defects at the second interconnection level and is well sealed.

It should be remembered that if by way of example the present invention is described for a specific process, however in general the principles on which it is based are applicable to a different process for formation of a device edge morphological structure comprising a dielectric multilayer with amorphous planarizing material different from SOG. The present invention is particularly advantageous when the tungsten plug technique is used for formation of the contact VIAS.

It can be observed that although the present invention is described in relation to an intermetallization dielectric multilayer, it is also applicable for a dielectric multilayer used as intermediate dielectric and comprising an SOG-type layer. It is accordingly applicable even to devices having a single interconnection level. More generally, i.e., the present invention is applicable to a dielectric multilayer following which a metallization layer is to be formed.

In addition, although a typical dielectric multilayer comprising two TEOS layers enclosing a SOG layer is described, the multilayer can have a different composition. For example, the TEOS layers could be replaced by other dielectric materials, and a different number of layers, but comprising in any case an amorphous planarizing material.

It should be remembered that the two regions 3' and 4' in which the device edge morphological structure has been divided in accordance with the present invention represent only a diagrammatic and not a rigid division of the structure, useful for description purposes. It should also be remembered that in relation to the present invention the highest level at which the dielectric multilayer is to be ended should be considered in relation to the region occupied by the device edge morphological structure. In some zones of the circuit the height can be greater because of the presence of additional structures, such as the structures of the transistor gates or memory cells which as mentioned above include superimposition, for example, of polysilicon layers.

It is also noted that within the framework of the present invention if the intermediate process structure on which is to be formed the dielectric multilayer does not provide a higher region or a region sufficiently high with respect to the rest of the device edge morphological structure, it is possible, before formation of the dielectric multilayer, to artificially create a zone with a higher level and then have the dielectric multilayer terminate in that zone. For example, a polysilicon bead or a field oxide barrier can be formed inside the edge region. Advantageously for this purpose there can be used process steps and masks already present in the formation process of the transistors and/or memory cells for example in the case of CMOS technology.

Although the above description is given for the case of a two-level interconnection process, the process in accordance with the present invention is of course applicable even for several metallization levels if for each pair of two contiguous levels the principles of the present invention are applied. Typically an intermetallization dielectric multilayer is placed between each pair of successive layers to partially insulate them.

Obviously modifications and changes all however falling within the scope of the present invention as defined in the following claims can be made to the process for the formation of a device edge morphological structure described and illustrated above.

That which is claimed is:

1. A process for forming a device edge morphological structure for protecting and sealing peripherally an electronic circuit integrated in a major surface of a substrate of semiconductor material, the method comprising the steps of:

forming a dielectric multilayer over an intermediate process structure, the dielectric multilayer comprising a layer of amorphous planarizing material; and partially removing the dielectric multilayer so as to create at least one peripheral termination thereof in the device edge morphological structure so that the peripheral termination is located in a zone of the intermediate process structure relatively higher than a level of the major surface of the substrate as compared with adjacent zones of the intermediate structure at least internally toward the electronic circuit in so far as to the device edge morphological structure.

2. A process according to claim 1, wherein said intermediate process structure comprises a first layer of conducting material having a peripheral termination; and wherein said peripheral termination of said dielectric multilayer is placed more internally towards the electronic circuit than the peripheral termination of said first layer of conducting material.

3. A process according to claim 1, wherein the peripheral termination of said dielectric multilayer is located on a layer of conducting material.

4. A process according to claim 3, wherein the peripheral termination of the dielectric multilayer is located in a zone where said layer of conducting material is placed over an intermediate dielectric layer.

5. A process according to claim 1, further comprising the step of forming and patterning of at least one first and one second overlying layer of conducting material between which said dielectric multilayer is interposed; and wherein the step of partially removing the dielectric multilayer in the device edge morphological structure comprises using an opening in a definition mask for a contact VIA between said first and second layers of conducting material.

6. A process according to claim 5, wherein the opening in said definition mask for a contact VIA is extended to an extreme periphery of the device and comprises an adjacent scribe line.

7. A process according to claim 1, further comprising the step of before formation of said dielectric multilayer an additional layer is formed on only part of said intermediate process structure and said peripheral termination of the dielectric multilayer is located over said additional layer.

8. A process according to claim 7, further comprising the step of using a CMOS process; and wherein said additional layer comprises a polysilicon bead.

9. A process according to claim 7, wherein said additional layer comprises a field oxide island.

10. A process according to claim 1, wherein that said amorphous planarizing material is formed by a spinning technique.

11. A process for forming a device edge morphological structure for protecting and sealing peripherally an electronic circuit integrated in a major surface of a substrate of semiconductor material, the method comprising the steps of:

forming an intermediate process structure;

forming a dielectric multilayer over the intermediate process structure, the dielectric multilayer comprising a layer of amorphous planarizing material; and partially removing the dielectric multilayer so as to create at least one peripheral termination thereof in the device edge morphological structure so that the peripheral termination is located in a zone of the intermediate process structure relatively higher than a level of the major surface of the substrate.

12. A process according to claim 11, wherein said intermediate process structure comprises a first layer of conducting material having a peripheral termination; and wherein said peripheral termination of said dielectric multilayer is placed more internally towards the electronic circuit than the peripheral termination of said first layer of conducting material.

13. A process according to claim 11, wherein the peripheral termination of said dielectric multilayer is located on a layer of conducting material.

14. A process according to claim 13, wherein the peripheral termination of the dielectric multilayer is located in a zone where said layer of conducting material is placed over an intermediate dielectric layer.

15. A process according to claim 11, further comprising the step of forming and patterning of at least one first and one second overlying layer of conducting material between which said dielectric multilayer is interposed; and wherein the step of partially removing the dielectric multilayer in the device edge morphological structure comprises using an opening in a definition mask for a contact VIA between said first and second layers of conducting material.

16. A process according to claim 15, wherein the opening in said definition mask for a contact VIA is extended to an extreme periphery of the device and comprises an adjacent scribe line.

17. A process according to claim 11, further comprising the step of before formation of said dielectric multilayer an additional layer is formed on only part of said intermediate process structure and said peripheral termination of the dielectric multilayer is located over said additional layer.

18. A process according to claim 17, further comprising the step of using a CMOS process; and wherein said additional layer comprises a polysilicon bead.

19. A process according to claim 17, wherein said additional layer comprises a field oxide island.

20. A process according to claim 11, wherein said amorphous planarizing material is formed by a spinning technique.

* * * * *